United States Patent [19]

Dash et al.

[11] 4,399,605

[45] Aug. 23, 1983

[54] METHOD OF MAKING DENSE COMPLEMENTARY TRANSISTORS

[75] Inventors: Somanath Dash; Richard R. Garnache, both of South Burlington; Ronald R. Troutman, Essex Junction, all of Vt.

[73] Assignee: International Business Machines Corporation, Armonk, N.Y.

[21] Appl. No.: 352,990

[22] Filed: Feb. 26, 1982

[51] Int. Cl.$^3$ .................... H01L 21/265; H01L 21/28
[52] U.S. Cl. .................... 29/571; 29/576 B; 29/578; 29/591; 148/187; 357/42
[58] Field of Search ............ 29/571, 578, 591, 576 B; 148/187; 357/42

[56] References Cited

U.S. PATENT DOCUMENTS

| | | | |
|---|---|---|---|
| 3,933,529 | 1/1976 | Goser | 148/1.5 |
| 4,002,501 | 1/1977 | Tamura | 148/1.5 |
| 4,097,314 | 6/1978 | Schlesier et al. | 148/187 X |
| 4,180,596 | 12/1979 | Crowder et al. | 29/591 X |
| 4,183,134 | 1/1980 | Oehler et al. | 29/571 |
| 4,276,688 | 7/1981 | Hsu | 29/571 |
| 4,279,069 | 7/1981 | Beguwala et al. | 29/591 X |
| 4,312,680 | 1/1982 | Hsu | 29/571 X |
| 4,329,186 | 5/1982 | Kotecha et al. | 29/571 X |
| 4,335,504 | 6/1982 | Lee | 148/187 X |
| 4,364,166 | 12/1982 | Crowder et al. | 148/188 X |
| 4,373,251 | 2/1983 | Wilting | 148/187 X |
| 4,374,700 | 2/1983 | Scott et al. | 29/591 X |

Primary Examiner—G. Ozaki
Attorney, Agent, or Firm—Stephen J. Limanek

[57] ABSTRACT

A method is provided for making complementary field effect transistors in a semiconductor layer having a first portion including an N type transistor with a channel region defined by N+ source and drain regions and having a second portion including a P type transistor with a channel region defined by P+ source and drain regions. An insulating layer is disposed over the first and second portions with thin insulating films formed over the channel regions. The steps of the method include applying a masking layer over the insulating layer having an opening over one of the portions, introducing a first impurity into the channel region of the one portion for channel tailoring purposes, depositing a first conductive refractory material on the thin insulating film located over the channel region of the one portion, removing the masking layer, introducing a second impurity into the channel region of the other portion for channel tailoring purposes and depositing a second conductive material on the thin insulating film located over the channel region of the other portion and in contact with the first conductive material. The first and second conductive materials have different work functions. The first conductive material is, preferably, platinum silicide while the second conductive material may be aluminum.

23 Claims, 9 Drawing Figures

METHOD OF MAKING DENSE COMPLEMENTARY TRANSISTORS

TECHNICAL FIELD

This invention relates to a method of making dense integrated semiconductor structures and, more particularly, to a simple method of making a dense array of transistors in the complementary metal oxide semiconductor (CMOS) technology wherein both N and P channel transistors are formed on a common substrate.

BACKGROUND ART

Even at the present lithography capability, cooling limitations in integrated semiconductor structures can constrain the amount and type of functionality when transistors are made in an N channel technology. The cooling problem becomes more severe as the size of the integrated semiconductor structure or chip increases and the lithographic dimensions decrease. An important resolution to this problem has been found in the use of the CMOS technology wherein the devices draw virtually no standby power.

It is known that in bulk CMOS technology, an inadvertent bipolar device is formed from the several N and P type regions which acts as a parasitic silicon controlled rectifier. As long as the effective base widths of these devices are sufficiently large, the parasitic bipolar effects remain relatively unimportant in the operation of the CMOS devices. However, when forming very dense devices such as in the very large scale integration technology, such large widths waste an inordinate amount of area in the semiconductor structure or chip. To eliminate these parasitic bipolar effects, it is known to process the CMOS devices on an insulating substrate, such as a sapphire substrate, to dielectrically isolate the N channel device from the P channel device.

Processes for providing CMOS devices are taught in, e.g., U.S. Pat. Nos. 4,002,501, filed June 16, 1975, and 4,183,134, filed Dec. 11, 1978. These patents teach processes for making complementary devices which have controlled channel lengths and low gate overlap capacitance by the use of thick insulators over their source and drain region.

DISCLOSURE OF THE INVENTION

It is an object of this invention to provide an improved simple process for CMOS technology wherein a denser structure is made with more tightly controlled device and wiring parameters at low cost. The process may be used in, e.g., bulk semiconductor, silicon-on-sapphire and silicon-on-insulator technologies.

In accordance with the teachings of this invention, there is provided a method of making complementary field effect transistors in a semiconductor layer having a first portion including an N type transistor with a channel region defined by N+ source and drain regions and having a second portion including a P type transistor with a channel region defined by P+ source and drain regions. An insulating layer is disposed over the first and second portions with thin insulating films formed over the channel regions. The steps of the method include applying a photoresist layer over the insulating layer having an opening over one of the portions, introducing a first impurity into the channel region of the one portion to adjust the impurity therein, depositing a first conductive material on the thin insulating film located over the channel region of the one portion, removing the photoresist layer, introducing a second impurity into the channel region of the other portion to adjust the impurity therein and depositing a second conductive material on the thin insulating film located over the channel region of the other portion and in contact with the first conductive material, with the second conductive material having a different work function than that of the first conductive material. The first conductive material is, preferably, platinum silicide while the second conductive material may be aluminum.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
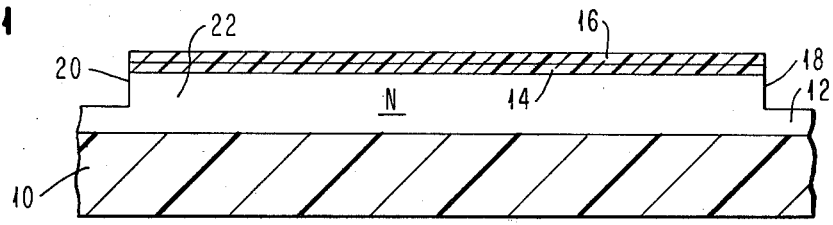
FIGS. 1–9 are sectional views of the CMOS structure made after successive steps during the process of the present invention.

Referring to the drawings in more detail, there is illustrated in FIG. 1 a sectional view of the CMOS structure made in accordance with the process of the present invention during an early stage of the fabrication thereof. The structure includes an insulating substrate 10, which may be made of sapphire, and an epitaxial semiconductor layer 12, preferably N type silicon, grown on the insulating layer 10. A thin layer of silicon dioxide 14 is grown on the silicon layer 12 and a layer of silicon nitride 16 is deposited, preferably by known low pressure chemical vapor deposition techniques, on the silicon dioxide layer 14. The thickness of the epitaxial silicon layer 12 may be 0.5 micrometers and each of the layers 14 and 16 may be 15 nanometers. With an A-level mask, openings 18 and 20 are formed in the epitaxial layer 12 to define a silicon island 22 by a photoresist mask, not shown, by etching the silicon nitride and silicon dioxide layers 16 and 14, respectively, in carbon tetrafluoride (CF$_4$) and oxygen gas followed by carbon tetrafluoride and hydrogen gas and by etching about 0.3 micrometers of the epitaxial silicon layer 12 in carbon tetrafluoride and oxygen. The photoresist mask is then stripped in an oxygen plasma and the surface of the remaining structure cleaned by any known process.

Figure 2:
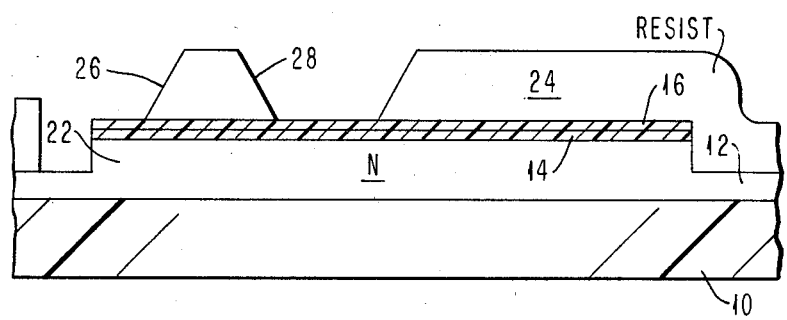
Figure 3:
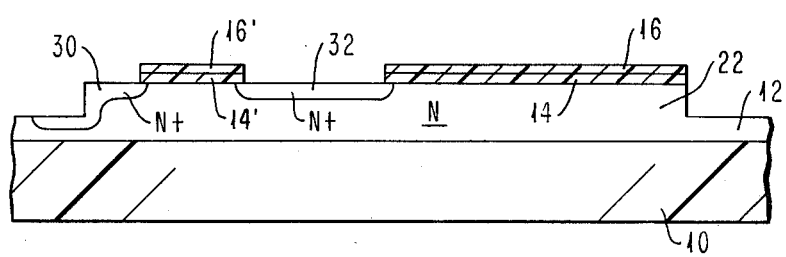

A B-level photoresist mask 24 having openings 26 and 28 therein is provided over the silicon nitride layer 16 and the silicon layer 12, as illustrated in FIG. 2 of the drawings. N+ source and drain regions 30 and 32, respectively, are then formed in the silicon island 22 by known arsenic ion implantation techniques at an energy of preferably, 180 KeV with a dose of $5 \times 10^{15}$ per square centimeter and then 50 KeV with a dose of $1 \times 10^{15}$ per square centimeter. The silicon nitride layer 16 and the silicon dioxide layer 14 are etched through the openings 26 and 28 of the photoresist layer 24, and the photoresist mask 24 is removed to form the structure shown in FIG. 3 of the drawings which includes thin silicon dioxide segment 14' and silicon nitride segment 16' disposed between source and drain regions 30 and 32. The arsenic is partially driven into the silicon island 22 by a dry nitrogen anneal at 900° C. to 1000° C. for 45 minutes.

Figure 4:
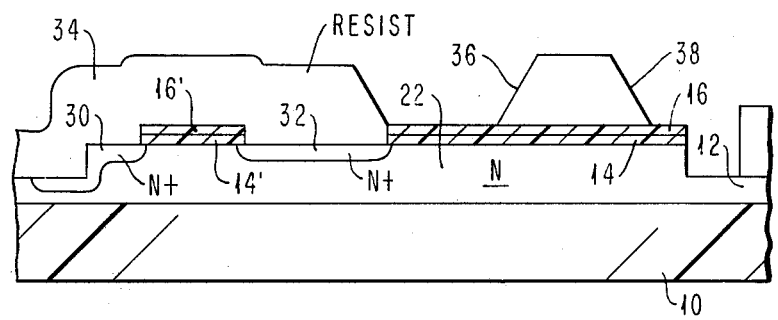
Figure 5:
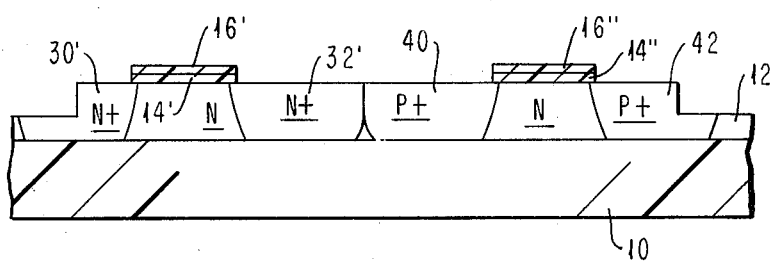

As indicated in FIG. 4 of the drawings, a C-level photoresist mask 34 having openings 36 and 38 therein is provided over the silicon nitride layer 16 and the silicon layer 12. P+ source and drain ion implants with, preferably, boron, are introduced into the silicon island 22 through the openings 36 and 38 in mask 34 first at an energy of, preferably, 80 KeV with a dose of $2\times10^{15}$ per square centimeter and then 30 KeV with a dose of $2\times10^-$per square centimeter. The silicon nitride layer 16 and the silicon dioxide layer 14 are etched through the openings 36 and 38 of the photoresist layer 34 and the photoresist mask 34 is removed by known techniques. The boron and the arsenic are driven further into the silicon island 22 by a dry nitrogen anneal at 800° C.–900° C. in 25% oxygen and nitrogen for 15 minutes and then at 1000° C. in nitrogen to form the N+ regions 30' and 32' and the P+ regions 40 and 42 in the silicon island 22, as shown in FIG. 5 of the drawings. It should be noted that thin silicon dioxide segments 14" and silicon nitride segments 16", similar to segments 14' and 16', are disposed between source and drain regions 40 and 42.

Figure 6:
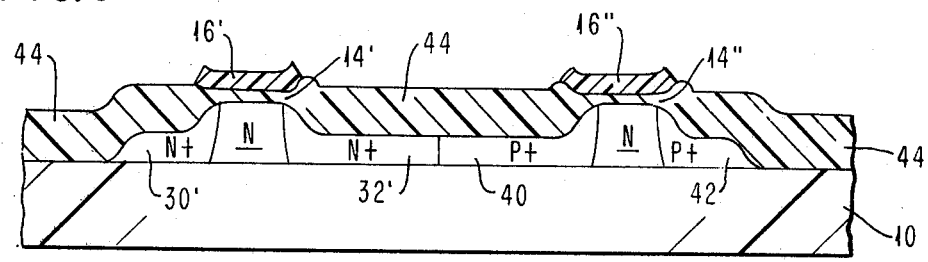

The structure illustrated in FIG. 5 is now heated to 900° C. and maintained at this temperature for approximately one hour in 4% hydrogen chloride gas and steam to convert the surfaces of the silicon regions 30, 32, 40 and 42 into silicon dioxide forming a relatively thick insulating layer 44 over the structure at all locations except at the portions protected by the silicon nitride segments 16' and 16", as shown in FIG. 6 of the drawings.

Figure 7:
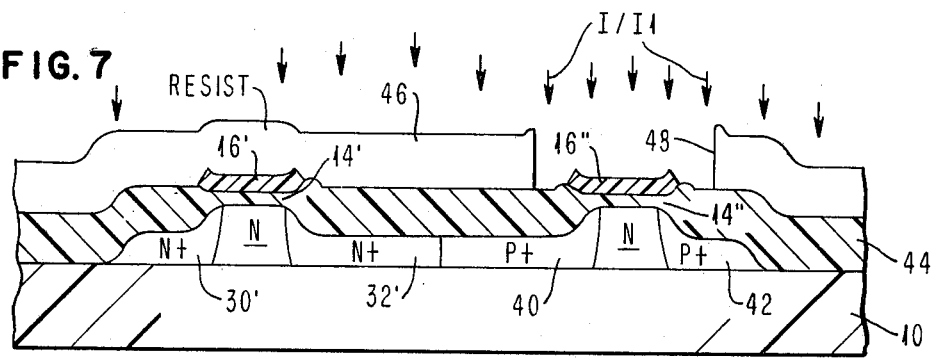

As indicated in FIG. 7 of the drawings, a D-level photoresist mask 46 is formed over the structure having an opening 48 arranged to expose the silicon nitride segment 16". Using the photoresist mask 46 as a barrier, ion-implanted phosphorous I/I1 is introduced through the opening 48 of the mask 46 for a P channel threshold adjustment under the silicon nitride and silicon dioxide segments 16" and 14", respectfully, as desired. A layer of polysilicon, preferably P+ type, about 200 nanometers thick, is deposited over the photoresist mask 46 and through the opening 48 onto the silicon nitride segment 16" and the adjacent portions of the thick insulating layer 44. By using known liftoff techniques, the photoresist mask 46 and all of the polysilicon that was deposited over the mask 46 are removed, with only the portion of the polysilicon deposited on the silicon nitride segment 16" and the adjacent portions of the thick insulating layer 44 remaining.

Figure 8:
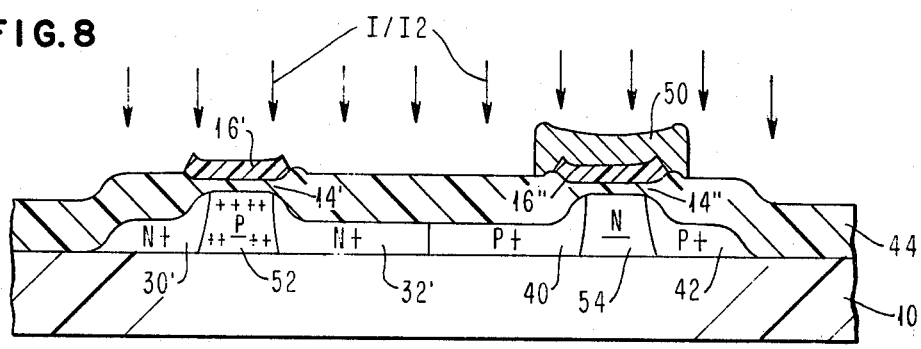
Figure 9:
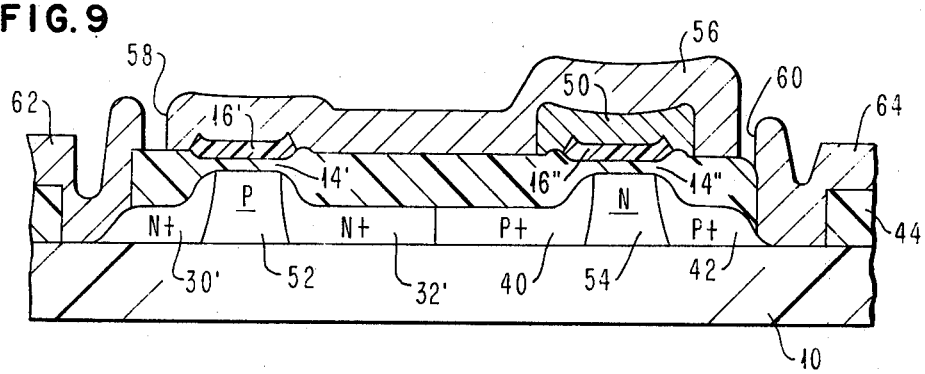

A layer of platinum is then deposited over the structure and reacted, by appropriate heating, with the polysilicon remaining on the silicon nitride segment 16" and the adjacent portions of the thick insulating layer 44 to form a platinum silicide gate electrode 50 as shown in FIG. 8 of the drawings. All platinum which did not react with polysilicon is removed by a suitable etchant, e.g., aqua regia, as is known.

With the platinum silicide gate electrode 50 and the thick insulating layer 44 acting as a mask, a boron ion implant I/I2 is performed through the thin silicon nitride and silicon dioxide segments 16' and 14', respectively. This implant effectively converts a segment of the N type epitaxial layer 12 into a P type region 52, indicated in FIG. 8, which is used for the N channel transistor, while also tailoring the threshold of the N channel transistor which includes source and drain regions 30' and 32'. N type region 54 is used for the P channel transistor which includes source and drain regions 40 and 42. The boron ion implant I/I2 first uses an energy of approximately 30 KeV and a dose of $6\times10^{11}$ per square centimeter and then an energy of approximately 130 KeV and a dose of $2\times10^{12}$ per square centimeter. To activate the implanted ions, the structure is annealed at 800° C. to 900° C. in nitrogen for approximately 15 minutes.

An E-level mask, not shown, is used to define contacts, as required, and the contact areas are opened by any conventional techniques, such as by the use of a reactive ion etch with carbon tetrafluoride and hydrogen and a wet etch.

With the use of an F-level mask, the deposition of a conductive layer, such as aluminum, titanium or a refractory metal silicide, and known liftoff techniques, a conductive line 56 is defined by forming openings such as 58 and 60 in the conductive layer. The conductive line 56 acts as the gate electrode for the N channel transistor and as a contact with the platinum silicide gate electrode 50 of the P channel transistor of the CMOS device.

It can be seen that the method in accordance with the teachings of this invention is very simple, requiring only six masking steps and provides a very dense CMOS structure. The channel lengths of the P channel and N channel transistors are tightly controlled to provide short channels resulting in higher speeds. Since the process provides thick oxides over the sources and drains of the P channel and N channel transistors, the structure has a low gate electrode overlap capacitance. Furthermore, since the gate electrode material for the P channel gate electrode is platinum silicide and the gate electrode material for the N channel gate electrode is, e.g., aluminum or titanium, having different work functions, both the P channel and N channel transistors threshold voltages have a lower value, which is particularly important when scaling integrated circuits to very high densities and low voltages. By using the phosphorous and boron ion implant techniques I/I1 and I/I2, respectively, the channel doping profiles for both the P channel and N channel transistors are well controlled. It should also be noted that the platinum silicide gate electrode 50 is used effectively as both an ion implant barrier and as a high work function material for controlling the magnitude of the threshold voltage of the P channel transistor.

It should be understood that, although details have been recited, many of the process steps can be modified within the teachings of this invention. For example, the ion implant doses and energy levels, as well as the oxidation and ion drive-in times and temperatures, are recited only as being typical. Also, the gate electrode 50 may be made of other materials, such as, a cobalt, iridium, molybdenum, tantalum, tungsten or rhodium silicide, or refractory metals, such as tungsten, molybdenum, and tantalum, or combinations of polysilicon and refractory materials, and the conductive line 56 may be made not only of aluminum or titanium but also of molybdenum or tungsten, or of a refractory silicide.

While the invention has been particularly shown and described with reference to perferred embodiments thereof, it will be understood by those skilled in the art that various changes in form and details may be made therein without departing from the spirit and scope of the invention.

What is claimed is:

1. A method of making complementary field effect transistors in a semiconductor layer having a first portion including an N type transistor having a channel region defined by N type source and drain regions and having a second portion including a P type transistor having a channel region defined by P type source and drain regions, with an insulating layer disposed over said first and second portions, the method comprising the steps of:

applying a masking layer over said insulating layer having an opening disposed over one of said portions, introducing a first impurity into the channel region of said one portion to adjust the impurity therein, depositing a first conductive material on said insulating layer over the channel region of said one portion, removing said masking layer, introducing a second impurity into the channel region of the other of said first and second portions to adjust the impurity therein, and depositing a second conductive material on said insulating layer over the channel region of said other portion and in contact with said first conductive material, said second conductive material having a different work function than that of said first conductive material.

2. A method as set forth in claim 1 wherein said first conductive material includes a refractory material.

3. A method as set forth in claim 1 wherein said first conductive material is a metal silicide.

4. A method as set forth in claim 3 wherein said metal silicide is one of the group including platinum, tantalum, tungsten, molybdenum, iridium, cobalt and rhodium silicides.

5. A method as set forth in claim 3 wherein said metal silicide is platinum silicide.

6. A method as set forth in claim 3 wherein said second conductive material is made of aluminum.

7. A method as set forth in claim 3 wherein said second conductive material is made of titanium.

8. A method as set forth in claim 1 wherein said first conductive material includes a layer of P+ type polysilicon deposited over the channel region of said one portion followed by a layer of refractory metal deposited over said polysilicon layer.

9. A method as set forth in claim 8 further including the step of heating said polysilicon and refractory metal layers to form a layer of metal silicide.

10. A method of making complementary field effect transistors in a semiconductor layer having a first portion including an N type transistor having a channel region defined by N+ type source and drain regions and having a second portion including a P type transistor having a channel region defined by P+ source and drain regions, with an insulating layer disposed over said first and second portions, the method comprising the steps of:

applying a photoresist layer over said insulating layer having an opening over said second portion, introducing a first impurity into the channel region of said second portion to adjust the impurity therein, depositing a first conductive material on said insulating layer over the channel region of said second portion, removing said photoresist layer, introducing a second impurity into the channel region of said first portion to adjust the impurity therein, and depositing a second conductive material on said insulating layer over the channel region of said first portion contacting said first conductive material, said second conductive material having a different work function than that of said first conductive material.

11. A method as set forth in claim 10 wherein said first conductive material includes a refractory material.

12. A method as set forth in claim 10 wherein said first conductive material is a metal silicide.

13. A method as set forth in claim 12 wherein said second conductive material is made of aluminum.

14. A method as set forth in claim 10 wherein said first conductive material includes a layer of P+ type polysilicon and a layer of refractory metal.

15. A method of making N channel and P channel field effect transistors in an N type siicon layer supported on an insulating medium comprising the steps of:

forming a thin layer of silicon dioxide on said silicon layer, depositing a thin layer of silicon nitride on said silicon dioxide layer, defining a silicon island in said silicon layer, defining source, drain and channel regions in one end of said island for said N channel transistor, protecting said one end of said island while defining source, drain and channel regions in the other end of said island for said P channel transistor, growing a thick layer of silicon dioxide over said source and drain regions, applying a masking layer over said island having an opening over the source, drain and channel regions of said P channel transistor, introducing an N type impurity into the channel region of said P channel transistor, depositing a first conductive material on said thin silicon nitride layer over the channel region of said P channel transistor, removing said masking layer, introducing a P type impurity into the channel region of said N channel transistor, and depositing a second conductive material on said thin silicon nitride layer over the channel region of said N channel transistor and to contact said first conductive material, said first and second conductive materials having different work functions.

16. A method as set forth in claim 15 wherein said N type impurity is phosphorus and said P type impurity is boron.

17. A method as set forth in claim 15 wherein said masking layer is a layer of photoresist.

18. A method as set forth in claim 15 wherein said first conductive material includes a refractory material.

19. A method as set forth in claim 15 wherein said first conductive material is a metal silicide.

20. A method as set forth in claim 15 wherein said first conductive material includes a layer of P+ type polysilicon and a layer of refractory metal.

21. A method as set forth in claim 20 further including the step of heating said polysilicon and refractory metal layers to form a layer of metal silicide.

22. A method as set forth in claim 21 wherein said metal silicide is platinum silicide.

23. A method as set forth in claim 22 wherein said second conductive material is aluminum.

* * * * *